Figure 1:
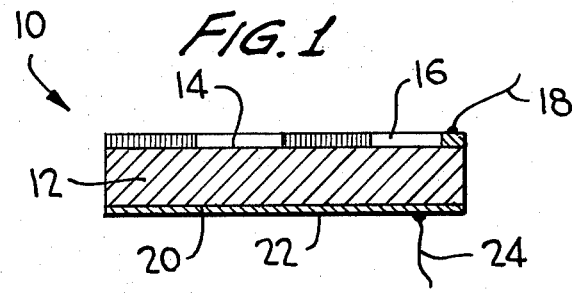

United States Patent [19]

Lindmayer

[11] 4,297,391
[45] Oct. 27, 1981

[54] METHOD OF APPLYING ELECTRICAL CONTACTS TO A PHOTOVOLTAIC CELL

[75] Inventor: Joseph Lindmayer, Bethesda, Md.

[73] Assignee: Solarex Corporation, Rockville, Md.

[21] Appl. No.: 3,945

[22] Filed: Jan. 16, 1979

[51] Int. Cl.³ .................... H01L 31/04; H01L 21/283
[52] U.S. Cl. ...................................... 136/256; 29/572; 136/255; 427/75; 427/88; 427/34; 427/423; 148/177; 427/74
[58] Field of Search ...................... 427/74, 75, 88, 423, 427/34; 136/89 CC, 85 SG; 148/177

[56] References Cited

U.S. PATENT DOCUMENTS

| 3,347,698 | 10/1967 | Ingham | 427/423 |
| 3,736,180 | 5/1973 | Fischer et al. | 427/74 |
| 3,895,975 | 7/1975 | Lindmayer | 148/178 |
| 3,904,453 | 9/1975 | Revesz et al. | 427/74 |
| 3,990,097 | 11/1976 | Lindmayer | 357/30 |
| 4,003,770 | 1/1977 | Janowiecki et al. | 156/613 |
| 4,031,268 | 6/1977 | Fairbairn | 427/423 |
| 4,056,879 | 11/1977 | Lindmayer | 29/572 |
| 4,082,568 | 4/1978 | Lindmayer | 136/89 CC |
| 4,105,471 | 8/1978 | Yerkes et al. | 427/75 |
| 4,124,455 | 11/1978 | Lindmayer | 427/89 |

OTHER PUBLICATIONS

Electronics, vol. 49, No. 24, pp. 53, 54, "Thick Films Ease Contact Attachment", Nov. 1976.

Primary Examiner—John D. Smith
Attorney, Agent, or Firm—Watson, Cole, Grindle & Watson

[57] ABSTRACT

A method of forming an electrical contact on the surface of a photovoltaic cell in which particles of electrically conductive material are formed at a temperature in excess of the alloying temperature of the material and silicon, and thereafter spraying, e.g., flame spraying, arc spraying, or plasma spraying, the particles to one or both major surfaces of the cell so that the particles alloy with the silicon and adhere to the surface of the cell.

4 Claims, 4 Drawing Figures

METHOD OF APPLYING ELECTRICAL CONTACTS TO A PHOTOVOLTAIC CELL

The present invention relates in general to photovoltaic cells having electrical contacts on the front and/or back surfaces thereof. More specifically, it relates to a method for forming one or both of those electrical contacts and to the cells so produced.

As is well known in the art, photovoltaic cells are thin wafers of certain host materials, for example, monocrystalline silicon, which have been doped with suitable impurities so that the doped wafer has p or n characteristics. Thereafter, an impurity of the conductivity type opposite to that of the dopant is diffused or otherwise applied to the doped wafer to form a p-n photovoltaic junction at and closely adjacent to the front, light-receiving, major surface of the wafer. In general, when light energy impinges on the photovoltaic cell, electronhole pairs in the silicon are excited. Because of the presence of the p-n junction, which term is meant to include both a p-n and an n-p junction, electrons will be directed toward one major surface of the cell and holes toward the other major surface. In order to make the cell operable, it is typically necessary to apply electrical contacts to both major surfaces of the cell so that electrons excited by the impingement of light on the silicon or other host material are conducted away from the photovoltaic cell and, after causing work to be done, back to the photovoltaic cell to complete the circuit.

In a common photovoltaic cell, the electrical contact, or grid, is applied to a minor portion of the front, lightreceiving surface of the cell because a sufficient area of that surface must be maintained unimpaired by the electrical contact or grid to permit sufficient quantities of light to reach the front surface of the cell and to penetrate that surface. It is common to apply electrical contact materials such as an aluminum coating to the entirety of the back, protected surface of the cell, since it is not intended that light penetrate the body of the cell through that back surface.

Many improvements have been made in applying both front and back contacts to a photovoltaic cell. As an improvement in applying a grid-type contact to the front surface of the cell, attention is directed to my U.S. Pat. No. 4,082,568, issued Apr. 4, 1978, and U.S. Pat. No. 4,124,455, issued Nov. 7, 1978, in which an electrical contact has been applied to the front surface of the cell to form a grid. That grid of silver is plated on elements that include three separate layers, each of said layers overlying another layer and forming a unitary element. While this contact has proved highly efficient in forming the front surface grid-type contact of a photovoltaic cell, a reading of my patent will show that it involves not only materials, i.e., platinum group metals and silver, that are relatively expensive, but that it requires four deposition steps. In order to form the electrical contact, my preferred embodiment in U.S. Pat. Nos. 4,082,568 and 4,124,455 is to utilize vapor deposition in a vacuum system to deposit three layers of the base element. Subsequent to such vacuum deposition, the material of the cell is immersed in a bath utilizing a potassium silver cyanide formulation and silver is electroplated on the grid elements. While, to repeat, the contact so produced has been highly effective, it will be apparent that it is not easily modified to the production of a photovoltaic cell at the lowest possible cost.

In particular, a continuous assembly line is exceptionally difficult to set up when any step in the method employed by the assembly line involves the use of deposition in a vacuum. Generally, vacuum deposition requires that single cells or a batch of cells be placed in a vacuum chamber. Once the cells are in the chamber, time is required for the vacuum to be drawn, deposition to take place, and then the vacuum released and the batch withdrawn from the chamber. Any such vacuum deposition step in a method of making photovoltaic cells is, therefore, highly deleterious to the production of relatively inexpensive, assembly line methods of making photovoltaic cells.

Another problem that has become apparent in making a metallic contact for a photovoltaic cell is that in order to collect and conduct a sufficient quantity of electrons, it is necessary that the front or back contacts have a mass sufficient to enable them to conduct large quantities of electrons. Plating with silver, for example, requires an application of the metal from a bath layer after layer over a substantial period in order to obtain a contact of the required mass. Again, the necessity for applying contact materials over a period of time detracts from assembly line types of procedures.

Still another problem that has occurred in the application of metallic materials, particularly to the front surface of the solar cell is that thin layers of oxide may form on the surface of the cell and thereby substantially inhibit the deposition of the first metal from which the contact element is to be formed in adhering contact with the surface of the cell. Further, in applying additional layers of other materials to the contact elements, care must be taken that corrosion does not occur between the metal layers. If the formation of an oxide occurs between the metal layers, there will be a possibility that the various layers will not adhere to each other or will do so imperfectly so that subsequent delamination of parts or all of the metal contacts may occur.

It is, therefore, an important object of the present invention to provide a method of applying electrical contacts to a photovoltaic cell in such manner that the application will be suitable for use as part of an assembly line process, thereby rendering the production of really economic photovoltaic cells a probability. It is a further object of this invention to provide a process for applying electrical contacts to a photovoltaic cell, which process does not involve deposition from a vacuum. It is still a further object of the present invention to provide such a process in which the presence of a thin layer of oxide on the surface of a silicon wafer will not be substantially deleterious to the adherence of the contact material to the silicon surface.

In its most basic method form, my invention comprises applying an electrically conductive contact material to the surface of a photovoltaic cell by forming particles of material at a temperature in excess of the alloying temperature of the material and silicon, and spraying the particles to the surface of the cell at a distance such that the particles will contact the surface at such temperature that they will alloy with the silicon and thereby firmly adhere to the surface of the cell. It is presently contemplated that spraying of the particles may be accomplished by the methods commonly known as flame spraying, arc spraying or plasma spraying, and that fine particles, atoms or ions of a metallic material, such as aluminum, may be used to form the contacts.

According to my method, metallic particles may be sprayed on the front surface of the cell, which is that surface that is adapted to receive light impinging thereon and to permit such light to penetrate into the body of the cell. When a photovoltaic junction, i.e., a p-n junction, has already been formed at and just beneath the front surface of the cell, the metallic particles that are to be adhered to that surface will contact the surface at or above the alloying temperature, e.g., a temperature of 577° C. in the case of aluminum and silicon, but not at a temperature so high that the particles will penetrate the front surface of the cell to a degree sufficient to substantially damage the p-n junction.

When the spraying technique according to my invention is utilized to apply a metallic material, e.g., aluminum to the back or protected surface of the cell, the aluminum may be sprayed on the back surface without careful regard to the degree of penetration, i.e., the aluminum can reach the back surface of the cell at a temperature at which it will penetrate that back surface. Indeed, when by a process such as diffusion, a wafer of silicon doped, e.g., with boron as an impurity, is subjected to diffusion in a furnace utilizing phosphene as a source of phosphorus, and the back surface of the wafer is unprotected, p-n junctions will be formed at the front surface and at the back surface. In forming an electrical contact with aluminum by my method on the back surface of the cell, the aluminum may advantageously be sprayed on the back surface of the wafer at a temperature at which it will not only penetrate that back surface, but at a temperature at which it will penetrate the back surface to a degree sufficient to enable the aluminum to reach the p-n junction formed just beneath the back surface and overcome that back surface p-n junction and form in its stead a high-low or step junction at the back surface. In the type of cell just referred to, i.e., one that has been predoped with boron and where phosphorus has been diffused into the cell to form n-p junctions at the front and back surfaces, the back surface junction so formed will be a p+-p, high-low junction.

When spraying techniques of my method are applied to the front surface of the cell to form an electrical contact thereon, it will be apparent that particles will not be applied to the entirety of that surface, but only in the form of a grid that occupies a minor portion of the area of the front surface and therefore permits the ingress of light energy into the photovoltaic cell. In such instance, the pattern in which the metallic material is deposited on the front surface of the cell may be controlled by means of a shadow mask. When metallic particles are sprayed on the back surface of the cell, they will generally be applied to the entirety of that surface, since there is no requisite space that should not be spray-coated to allow light to enter the cell through that back surface.

Figure 2:
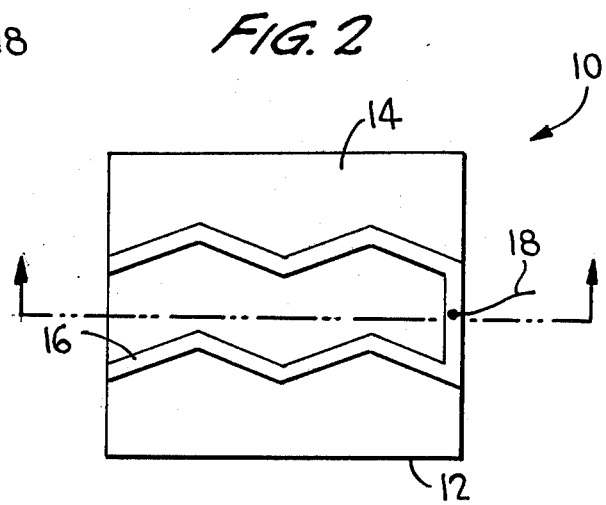
Figure 3:
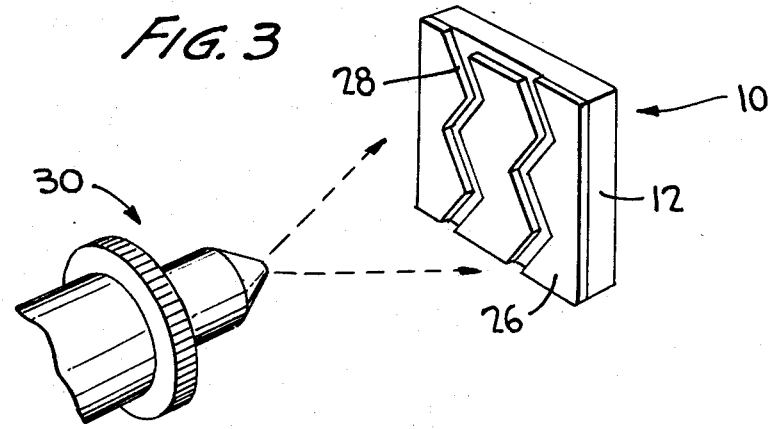
Figure 4:
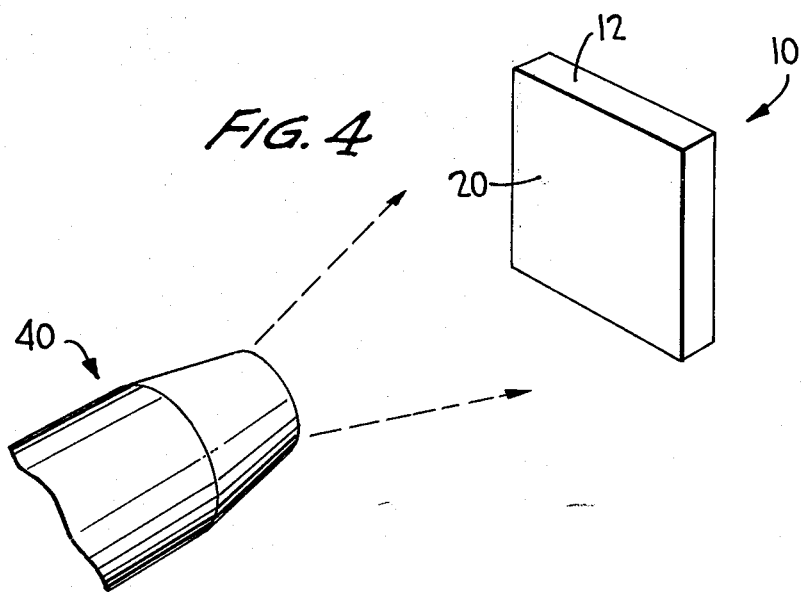

These and other objects, features and advantages of my invention will be more apparent when taken in connection with the diagrammatic illustrations of my method and product produced thereby in the accompanying drawing, which forms a part hereof, and in which:

FIG. 1 is a cross-sectional view of a photovoltaic cell having applied electrical contacts, FIG. 2 is a top view of the photovoltaic cell of FIG. 1, illustrating the front electrical contacts for the cell, FIG. 3 is a perspective view of one embodiment of a method for forming electrical contacts in accordance with the present invention, and FIG. 4 is a perspective view of another embodiment of a method for forming electrical contacts in accordance with the present invention.

Referring now to FIGS. 1 and 2, shown in FIG. 1 is a cross-section of photovoltaic cell 10 including wafer 12 of silicon having an electrical junction such as an n-p junction (not shown) just below front surface 14 of the wafer. Cell 10 is, of course, not drawn to scale. Front surface 14 of wafer 12 is adapted to be the light-receiving surface of cell 10 and has a plurality of bands 16 of electrically conductive material adhered thereto and forming an electrical contact for the surface. Bands 16 are, for illustration only, in a spaced, zig-zag type grid configuration and are connected to external wire means 18. The plurality of bands 16 on surface 14 are commonly referred to collectively as the front contact or grid of the photovoltaic cell.

Over back, non-light receiving surface 20 of wafer 12 is a continuous layer 22 of metal-containing material forming the electrical contact for that surface. Layer 22 is commonly referred to as a back contact for a cell. Electrically connected to layer 22 is external electrical contact means 24. Back contact 22 generally operates to close the electrical circuit brought into existence by the impingement of light on top surface 14 of cell 10.

FIG. 2 illustrates top surface 14 of cell 10 as shown in FIG. 1. Bands 16 in a grid-type pattern on surface 14 of cell 10 form the front electrical contact for the cell and function to collect electrons which have been formed by the n-p junction within wafer 12 when the surface is exposed to light. The particular grid pattern for bands 16 is of course exemplary of many types of grid patterns that may be used, as is the external configuration for the wafer.

In accordance with preferred modes of the present invention, bands 16 are are formed by spraying a molten metal-containing material such as by using a flame spray type apparatus or an arc spray type apparatus, or by plasma spraying, to apply the metal-containing material. The former apparatus is illustrated schematically in FIG. 3.

In FIG. 3, wafer 12 of a cell 10 is held in a suitably fixture (not shown) and plastic shadow mask 26 is positioned over top or front surface 14 of the wafer, the mask having open areas 28 corresponding to the design for the front contact of the completed photovoltaic cell 10 as shown in FIG. 2. Mask 26 may be of any suitable material which will not degrade under the influence of molten metal containing material. Preferably the mask is of polymer material so as to minimize the cost associated with the mask.

Positioned a predetermined distance from wafer 12 and overlying mask 26 is flame spray gun nozzle 30 forming a portion of a conventional flame spray type apparatus (not shown). Since the details of construction of flame spray gun 30 and associated equipment form no part of the present invention and are of a conventional nature, it is only stated that in conventional operation of such a gun, metal-containing wire, rod or powder is fed through the gun where it is melted and subjected to a high-velocity gas blast that propels the atomized particles so formed from the gun in a spray. Heat for melting the metal-containing wire, rod or powder is provided by burning acetylene, propane or hydrogen in oxygen, and compressed air is used to atomize and propel the molten metal-containing material onto a particular surface.

In applying bands 16, wafer 12 and mask 26 must be positioned a sufficient distance from gun 30 so that the molten metal containing material emanating from the gun has cooled to sufficient degree so that the material will not penetrate below the surface of the wafer and thereby adversely affect or even short the p-n junction near the surface of the wafer. In addition, gun 30 must be close enough to wafer 12 and associated mask 26 so that the particles strike surface 14 of the wafer 12 with enough plasticity to form a band free from discontinuities and which will firmly adhere to the surface. When spraying essentially pure aluminum from a flame spray gun at a temperature of about 700° C. to form front contacts, a distance of about 10 to 14 inches has been found to be satisfactory. Adherence is accomplished by alloying of the silicon and all or part of the electrically conductive material sprayed. However, by use of its term, alloying, herein, I do not mean to be limited to a specific, technical definition of that term but to include adherence at, e.g., somewhat lower temperatures where the process might be better termed sintering.

While the method of the present invention contemplates the spraying of a wide variety of electrically conductive materials including alloys and mixtures of metals to form the electrical contacts in cell 10, a presently preferred material is aluminum alone or in combination with minor amounts of other metals. Other metals or combinations of metals suitable for forming electrical contacts on photovoltaic cells are disclosed in U.S. Pat. No. 4,082,568 and are applicable to the present invention.

As is apparent, the thickness of the electrical contacts applied to surfaces 14 and 16 of cell 10 can be made as large as desired by simply spraying sufficient material. Electrical contacts having a thickness of about 1 to 10 microns have been found to be satisfactory for most photovoltaic cell applications.

FIG. 4 illustrates another embodiment of the method of the present invention where a plasma-arc spraying apparatus nozzle 40 is utilized to form layer 22 or back electrical contact on photovoltaic cell 10. Since layer 22 is to be generally continuous, a mask 26 as shown in FIG. 3 is not necessary. Preferably, however, the back contact or layer 22 is formed on surface 20 prior to the formation of the p-n junction so that the contact can act as a mask for that side of the wafer during diffusion of an impurity to form the junction.

The particular construction of the plasma-arc spraying apparatus like that of the flame spray gun 30 of FIG. 2, forms no part of the present invention. A conventional plasma-arc spraying apparatus is generally used for applying higher melting point materials and, in operation, partially ionizes a gas such as nitrogen or argon in an electric arc and passes the gas through a small orifice to produce a jet of high temperature gas moving at high velocity. In such an apparatus, the heat may be produced by an electric arc flame or by a plasma flame which may in itself constitute part of an electric arc or may be in the form of a free plasma stream, i.e., a stream of plasma which may be considered independent of the arc as it does not contribute to the electric flow between electrodes.

In applying layer 22 to surface 20 of wafer 12, plasma-arc spraying apparatus 40 is positioned a fixed distance from wafer 12 of cell 10. In contrast to the formation of bands 16 or front contacts on a cell 10 as shown in FIG. 2, the distance between apparatus 40 and cell 10 is not as critical since the p-n junction is not in close proximity to lower surface 20 of the wafer. Therefore, penetration of the sprayed metal containing material below surface 16 of the wafer is not undesirable and in fact, may be beneficial as a semiconductor-metal containing alloy, particularly a silicon-aluminum alloy on all or part of the back surface 20 of cell 10 provides certain operating advantages for a photovoltaic cell as is set forth in U.S. Pat. Nos. 3,895,975 and 3,990,097.

In the embodiments of the method illustrated in FIGS. 3 and 4, once sufficient metal-containing material has been applied to wafer 12 to form the electrical contacts, the spray reaching wafer is terminated and the applied metal containing material allowed to cool and solidify. In the case of the first embodiment as shown in FIG. 3, then the mask is removed to yield a photovoltaic cell having the appropriate electrical contacts.

While it is generally preferable that the metal-containing material be at least semi-molten when the material reaches the surface of cell 10, it is within the scope of the present invention that the sprayed particles of material are solidified when reaching the surface. In that instance, the solidified particles of material are adhered to each other and to the surface by the impacting force. Furthermore, it may not be necessary that the metal-containing material be entirely molten when exiting from the spraying apparatus. For the purposes of the present invention, it may be sufficient that the material exits the apparatus in finely divided form and in a heat-softened condition, the term "molten" used herein to encompass such a condition.

If desired, external electrical contact means 24 and 26 may be held contiguous to the appropriate surfaces of wafer 12 prior to the spraying of molten metal-containing material so that the formation of electrical contacts and their attachment to the external electrical contact means can be accomplished simultaneously.

With further respect to materials that can be sprayed on either the front surface or the back surface of the photovoltaic cell to form contacts thereon, aluminum is the preferred metal of which the electrically conductive material is comprised, either in whole or in part. Aluminum is far less expensive than other metals that have previously been used, such as silver. However, the subject invention should also be considered to include the spraying of other materials to form electrical contacts. In particular, zinc, which is easily solderable, may be sprayed with or over an aluminum contact. The use of zinc to form a contact material is highly desirable, but in a vacuum deposition process it has proved extremely difficult to handle. Other materials that may be sprayed according to my invention include nickel, titanium, palladium and chromium. However, expensive metals such as silver may also be utilized.

With respect to the masking means that is used when a front grid pattern is to be applied to the front surface of a photovoltaic cell, such mask can be composed of a material that is discarded after a single use. The masking means can comprise plastics, metal foil, or even pressure-sensitive tape. Indeed, it has been found that the mask may even be made of paper. When aluminum is sprayed at a temperature of about 577° C. on even a paper mask, it has been found that the aluminum will not, as might be expected, immediately burn up the mask, but the aluminum will tend in large measure to fail to adhere to the paper and to fall from it. Thus, the present spraying method lends itself to the use of inexpensive shadow masks that can be discarded immediately thereafter.

As stated hereinbefore, thin layers of oxide, even on the front surface of the silicon wafer, will not substantially detract from the ability of the sprayed-on particles to penetrate through that thin layer and alloy themselves with the underlying silicon. With respect to spraying the front surface of the cell, the problem that will present itself is having the spray arrive at a temperature that will be sufficient to enable good alloying or sintering through any oxide layer on that surface; yet care must be taken not to have the metallic particles arrive at a temperature such that they will penetrate too far below that front surface so as to materially damage the underlying p-n junction.

With respect to spraying a metal on the back surface of the cell, in one particular embodiment of my invention a layer of diffusion glass formed by the diffusion of an impurity, e.g., phosphorus, into a silicon wafer doped, e.g., with an opposite type impurity such as boron, has proved advantageous. For further reference to the use of a layer of diffusant glass on the back surface of the cell, attention is directed to the disclosures of my U.S. Pat. Nos. 3,990,097, issued Nov. 2, 1976, and 4,056,879, issued Nov. 8, 1977. In these patents the diffusant glass layer formed during furnace diffusion of an impurity into the silicon may be utilized here so that a metal, such as aluminum, may be sprayed on the back surface of the cell as that surface is overlaid with the diffusant glass.

In so doing the temperature at which the metallic material arrives at the diffusant glass layer will be high enough so that the metallic material will penetrate through the diffusant glass, into the back surface of the cell and into the silicon body of the cell to a degree sufficient to enable that metal, such as aluminum, to overcome the p-n junction formed just beneath the back surface of the cell and in its stead to form a step junction. In the mode of my invention just described, where the back surface junction is actually an n-p junction, the aluminum will overcome that n-p junction and form a p+-p junction in lieu thereof. A p+-p junction is of the type known as a high-low or step junction and is one wherein different concentrations of impurities, although of the same conductivity type, exist in contiguous strata of a cell. Of course, it will be apparent that even when the diffusant glass layer overlying the back surface of the wafer has been etched off, the spraying technique according to my invention may be applied to the back surface where, upon proper adjustment of temperature, the metallic material will penetrate the back surface and overcome the p-n junction that has been formed therein to provide a high-low junction.

The present invention has been found to form a cell that is operable and economically viable, and that eliminates the otherwise conventional vacuum deposition step in forming an electrical contact on the front or back of a cell. The elimination of that vacuum deposition step and the fact that the present process enables far more economic materials to be utilized, particularly for the front contacts of the cell, have resulted in the formation of a photovoltaic cell that promises great reductions in the dollars per watt cost of electricity produced by photovoltaic cells.

While the present invention has been described with reference to best modes thereof, it will be apparent that numerous alterations and modifications will be apparent to those of skill in this art without departing from the spirit of the invention. As to all such obvious alterations and modifications, it is desired that they be included within the purview of my invention, which is to be limited only by the scope, including equivalents, of the following, appended claims.

I claim:

1. A method of applying an electrically conductive contact to the back surface of a photovoltaic cell, said back surface having a p-n junction located beneath and closely adjacent thereto, comprising forming particles of a metallic material at a temperature in excess of the alloying temperature of said material and silicon, and spraying said particles toward said back surface from a distance and at a temperature such that said particles penetrate said back surface and overcome said back surface p-n junction to form a high-low junction at said back surface as well as a back contact by a single process step.

2. A method as claimed in claim 1, in which, prior to spraying said particles, a layer of diffusant glass is formed on said back surface and said particles are sprayed on said back surface at a temperature such that they penetrate said glass layer and said back surface and overcome said back surface p-n junction to form a high-low junction at said back surface.

3. A method as claimed in claim 1, in which said metallic material is comprised of aluminum.

4. A method as claimed in claim 1, in which said particles are sprayed toward said back surface by arc spraying.

* * * * *